US008201242B2

(12) United States Patent
Cohn et al.

(10) Patent No.: US 8,201,242 B2
(45) Date of Patent: Jun. 12, 2012

(54) METHOD AND APPARATUS FOR VERIFYING CONTENT REUSE RIGHTS AND RESOLVING RIGHTS IN THE PRESENCE OF MULTIPLE LICENSES

(75) Inventors: William Cohn, Lexington, MA (US); Keith Meyer, Southborough, MA (US); James Arbo, Chelmsford, MA (US); Vivek Shetty, Westford, MA (US)

(73) Assignee: Copyright Clearance Center, Inc., Danvers, MA (US)

( * ) Notice: Subject to any disclaimer, the term of this patent is extended or adjusted under 35 U.S.C. 154(b) by 1224 days.

(21) Appl. No.: 11/733,417

(22) Filed: Apr. 10, 2007

(65) Prior Publication Data

US 2007/0288434 A1 Dec. 13, 2007

Related U.S. Application Data

(60) Provisional application No. 60/812,362, filed on Jun. 9, 2006.

(51) Int. Cl.
*G06F 7/04* (2006.01)
*G06F 12/00* (2006.01)
*G06F 12/14* (2006.01)
*G06F 13/00* (2006.01)
*G06F 17/30* (2006.01)
*G11C 7/00* (2006.01)

(52) U.S. Cl. .......................................................... 726/21

(58) Field of Classification Search ........................ None
See application file for complete search history.

(56) References Cited

U.S. PATENT DOCUMENTS 6,526,438 B1 * 2/2003 Bienvenu et al. ............. 709/219
2004/0254884 A1 * 12/2004 Haber et al. ..................... 705/51
2005/0119975 A1 * 6/2005 O'Donnell ...................... 705/51
2005/0149549 A1 * 7/2005 Jaspers et al. ................. 707/102

FOREIGN PATENT DOCUMENTS

WO WO 01/35279 A 5/2001

OTHER PUBLICATIONS

Van de Sompel, et al.; "Reference Linking in a Hybrid Library Environment, Part 1: Frameworks for Linking"; D-Lib Magazine; vol. 5, Issue 4; Apr. 1999. Van de Sompel, et al.; "Reference Linking in a Hybrid Library Environment, Part 2: SFX, a Generic Linking Solution"; D-Lib Magazine; vol. 5, Issue 4; Apr. 1999.

(Continued)

*Primary Examiner* — Kaveh Abrishamkar
*Assistant Examiner* — Nadia Khoshnoodi
(74) *Attorney, Agent, or Firm* — Law Offices of Paul E. Kudirka

(57) ABSTRACT

A small program in a browser that a knowledge worker uses to search for content can be activated when the worker wants to determine available rights for a publication that has been found. When activated, the program accesses a rights advisor website that converts the URL of the publication in the browser to standard publication identifiers. The publication identifiers are then used to access a rights database and extract all rights associated with the publication. Based on selected characteristics of the worker and the organization to which the worker belongs, the rights are filtered and placed into a decision tree. The tree is then traversed from its lowest level upward to locate the most favorable rights and the resulting rights are presented to the worker via the browser.

24 Claims, 13 Drawing Sheets

OTHER PUBLICATIONS

Van de Sompel, et al.; "Reference Linking in a Hybrid Library Environment, Part 3: Generalizing the SFX solution in the "SFX@Ghent & SFX@LANL" Experiment"; D-Lib Magazine; vol. 5, Issue 10; Oct. 1999.

Van de Sompel, et al.; "Open Linking in the Scholarly Information Environment Using the OpenURL Framework"; D-Lib Magazine; vol. 7, No. 3; Mar. 2001.

Collins, et al.; "Context-Sensitive Linking: It's a Small World After All"; Serials Review, vol. 28, No. 4, 2002, pp. 267-282.

Shaw, et al.; "JISC Core Middleware and Shared Services Studies"; 2004 URL:http//ww.jisc.ac.uk/uploaded_documents/CMSS-Shawl.pdf.

SISIS Informationssysteme GmbH; "SISIS-Elektr V4.0 Administrtationshandbuch"; URL:http://w3.ub.uni-konstanz.de/v13/volltexte/2006/1841//pdf/elektra_admini_40.pdf.

National Information Standards Organization; "OpenURL Framework for Context-Sensitive Services"; NISO Press; Bethesda, Maryland, USA; 2005.

Apps, et al.; "Why OpenURL?"; D-Lib Magazine; vol. 12, No. 5; May, 2006.

Bennett, et al.; "A JISC Project-Open Linking in a Virtual Learning Environment, (OLIVE)"; Jan. 30, 2004 URL:http://www.jisc.ac.uk/ploaded_documents/OLIVE_Project_Report.pdf.

* cited by examiner

METHOD AND APPARATUS FOR VERIFYING CONTENT REUSE RIGHTS AND RESOLVING RIGHTS IN THE PRESENCE OF MULTIPLE LICENSES

BACKGROUND

This invention relates to digital rights display and methods and apparatus for determining reuse rights for content to which multiple licenses and subscriptions apply. Works, or "content", created by an author is generally subject to legal restrictions on reuse. For example, most content is protected by copyright. In order to conform to copyright law, content users often obtain content reuse licenses. A content reuse license is actually a "bundle" of rights, including rights to present the content in different formats, rights to reproduce the content in different formats, rights to produce derivative works, etc. Thus, depending on a particular reuse, a specific license to that reuse may have to be obtained.

Many organizations use content for a variety of purposes, including research and knowledge work. These organizations obtain that content through many channels, including purchasing content directly from publishers and purchasing content via subscriptions from subscription resellers. Subscriptions generally include some reuse rights that are conveyed to the subscriber. A given subscription service will generally try to offer a standard set of rights across its subscriptions, but large customers will often negotiate with the service to purchase additional rights. Thus, reuse rights may vary from subscription to subscription and the reuse rights available for a particular subscription may vary even across publications within that subscription. In addition, the reuse rights conveyed in these subscriptions often overlap with other rights and licenses purchased from license clearinghouses, or from other sources.

Many knowledge workers attempt to determine which rights are available for particular content before using that content in order to avoid infringing legitimate rights of rightsholders. However, at present, determining what reuse rights an organization has for any given publication is a time-consuming, manual procedure, generally requiring a librarian or legal counsel to review in advance of the use, all license agreements obtained from content providers and purchased from other sources which may pertain to the content and its reuse. The difficulty of this determination means that sometimes an organization will overspend to purchase rights for which it already has paid. Alternatively, knowledge workers may run the risk of infringing a reuse right for which they believe that the organization has a license, but which, in actuality, the organization does not.

SUMMARY

In accordance with the principles of the invention, a small program in a browser that a knowledge worker uses to search for content can be activated when the worker wants to determine available rights for a publication that has been found. When activated, the program accesses a rights advisor website and extracts all agreements stored therein that are applicable to the organization to which the worker belongs. The rights advisor then converts the URL of the publication in the browser to a standard publication identifier. The publication identifier is then used to determine agreements that are applicable to that publication. The agreements are further filtered based on selected characteristics of the worker and the organization to which the worker belongs and an applicable right is selected from each agreement, if available. The rights are then ordered from the most permissive to the most restrictive. The tree is then traversed from its lowest level upward and the resulting rights are presented to the worker via the browser.

In one embodiment, the worker can communicate with the rights advisor to purchase rights for a specific reuse for which the organization does not have rights.

In another embodiment, variables that are used to filter workers include the country where the worker is located, the location within that country and other attributes defined by the organization to which the worker belongs.

In still another embodiment, the rights database contains a predetermined set of reuse rights for each publication in the database and this predetermined set of rights is presented to the worker.

In yet another embodiment, the text of terms associated with each right are also presented to the worker along with the predetermined set of rights.

In another embodiment, publications in the rights database can be grouped into collections and a set of rights can be associated with a collection so that all publications in that collection inherit the rights associated with that collection.

DETAILED DESCRIPTION

Figure 1:
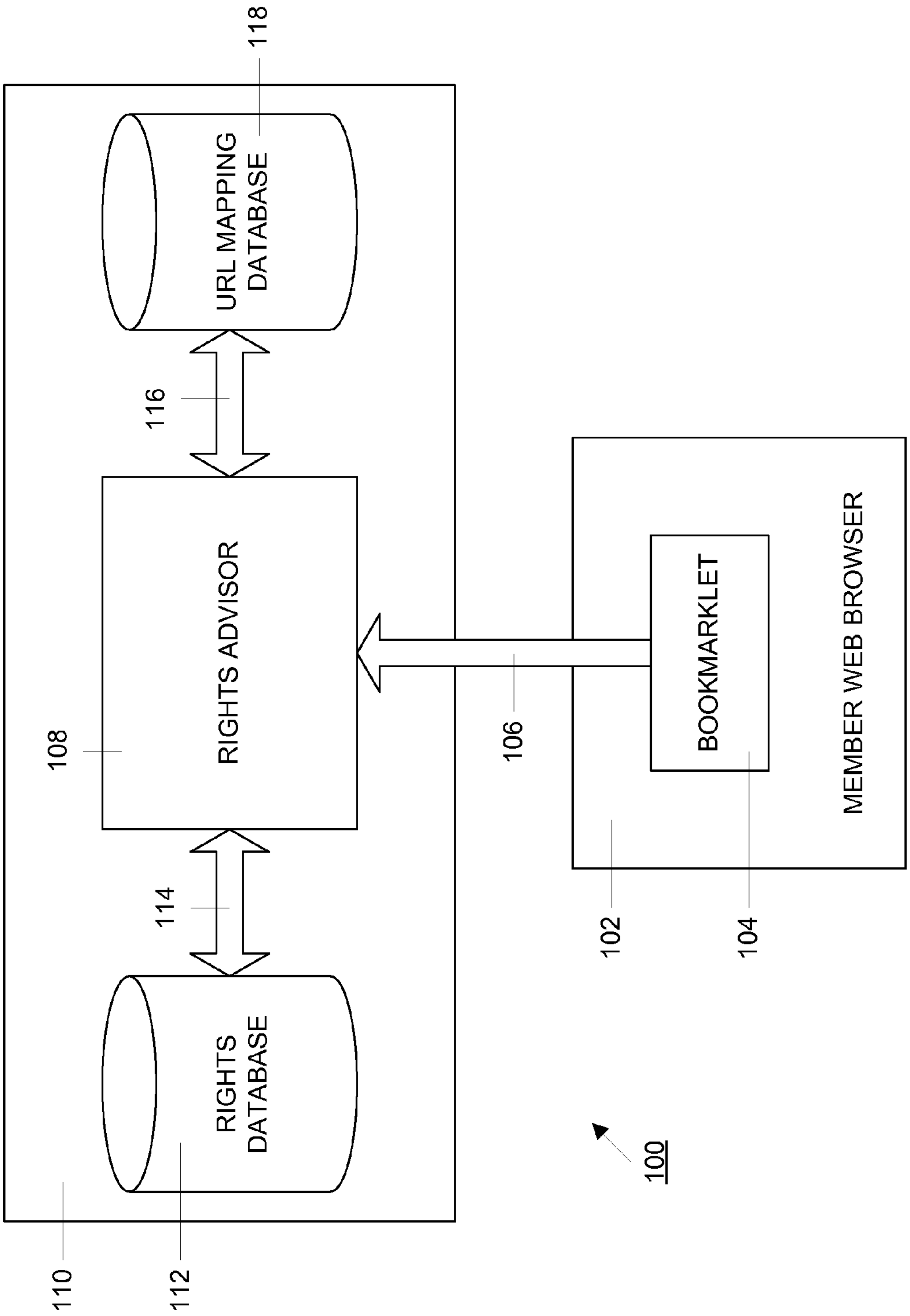
FIG. 1 is a block schematic diagram illustrating in a high level form the basic architecture of the inventive rights resolving system.
Figure 2:
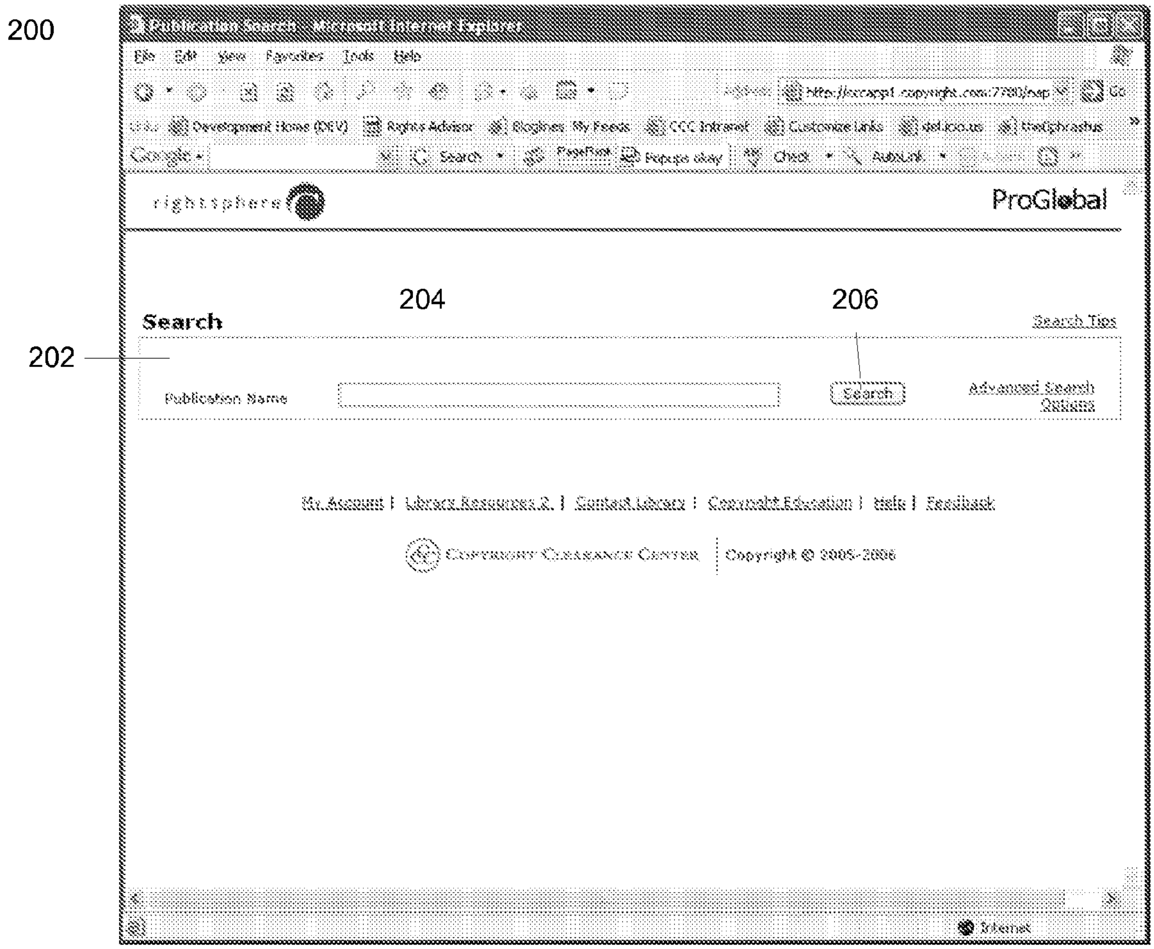
FIG. 2 is a typical screen display presented by a conventional search engine in a web browser.

FIG. 1 is a block schematic diagram illustrating one embodiment 100 constructed in accordance with the principles of the present invention. In this embodiment, a customer uses a conventional search engine in a web browser 102 to search for content. FIG. 2 shows a typical screen display presented by such a search engine. The web browser 200 includes a search field 202 that, in turn, includes a text box 204 for receiving a search phrase and a command button 206 for initiating a search for publications whose text includes the search phrase. The web browser 200 has been modified to include a small executable program called a "bookmarklet" that causes the browser to interact with a "rights advisor" program in accordance with the principles of the invention.

Figure 3:
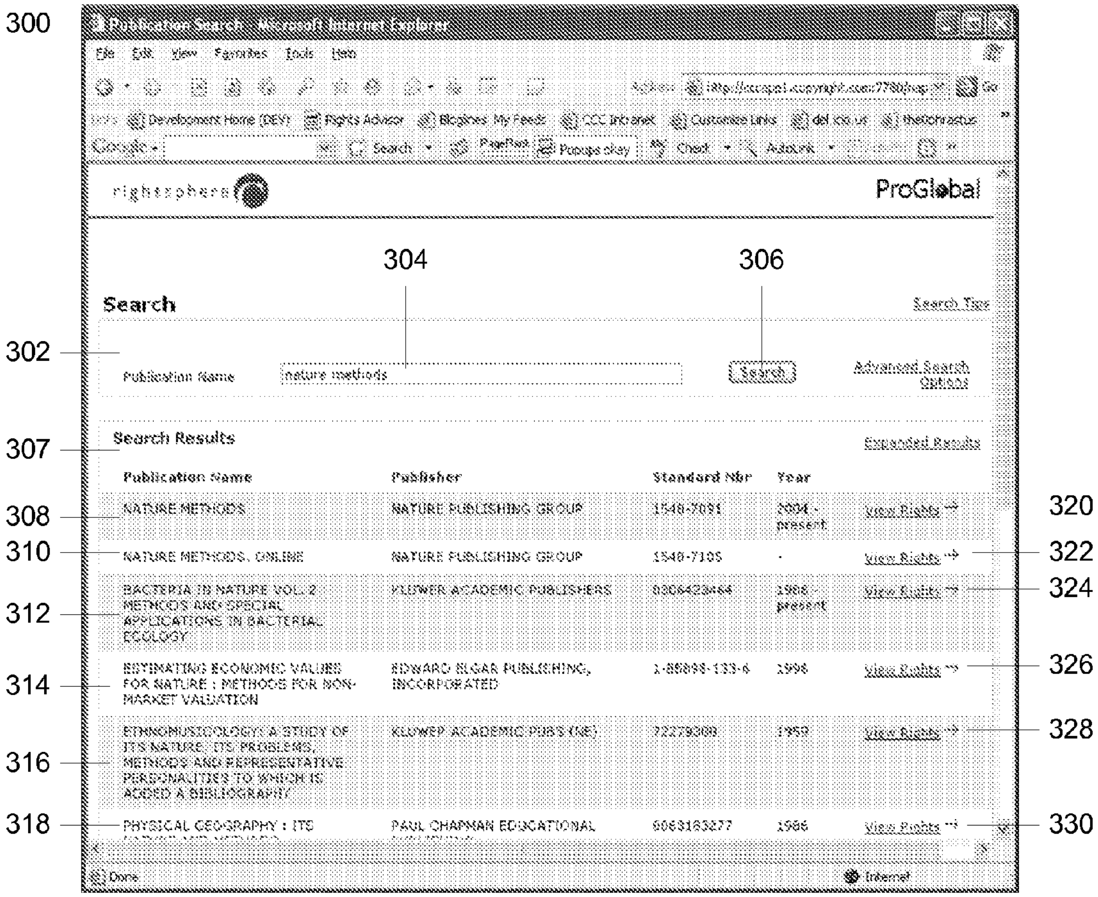
FIG. 3 is a typical display of content located by the search engine when the keywords "nature methods" have been entered into the text box. This figure shows the hyperlinks to a rights advisor web page generated in accordance with the principles of the invention.

In particular, FIG. 3 shows a typical display of content located by the search engine when the keywords "nature methods" have been entered into the text box 304 in the search field 302 of the browser 300 and the command button 306 has been selected. The search results are shown as a plurality of rows 308-318 in the list box 307. Each row includes information concerning a publication located in the search, including as is well-known, the Universal Resource Locator (URL) of the publication. In accordance with the invention, each row includes a hyperlink generated by the bookmarklet that enables a user to locate and display rights associated with that publication. For example, row 308 includes a hyperlink 320 that enables a user to locate and display rights for the "Nature Methods" publication displayed in that row. Similarly, rows 310-318 have hyperlinks 322-330 for locating and viewing rights associated with the publications displayed in those rows.

Returning to FIG. 1, when a hyperlink is selected, the bookmarklet 104 causes the web browser 102 to access a rights advisor web page 108 hosted by a server in a rights clearinghouse location. When the web page 108 is accessed, the bookmarklet sends the URL of the publication with which it is associated to the rights advisor web page 108. The right advisor web page 108 uses the publication URL to locate rights associated with the publication.

Figure 4:
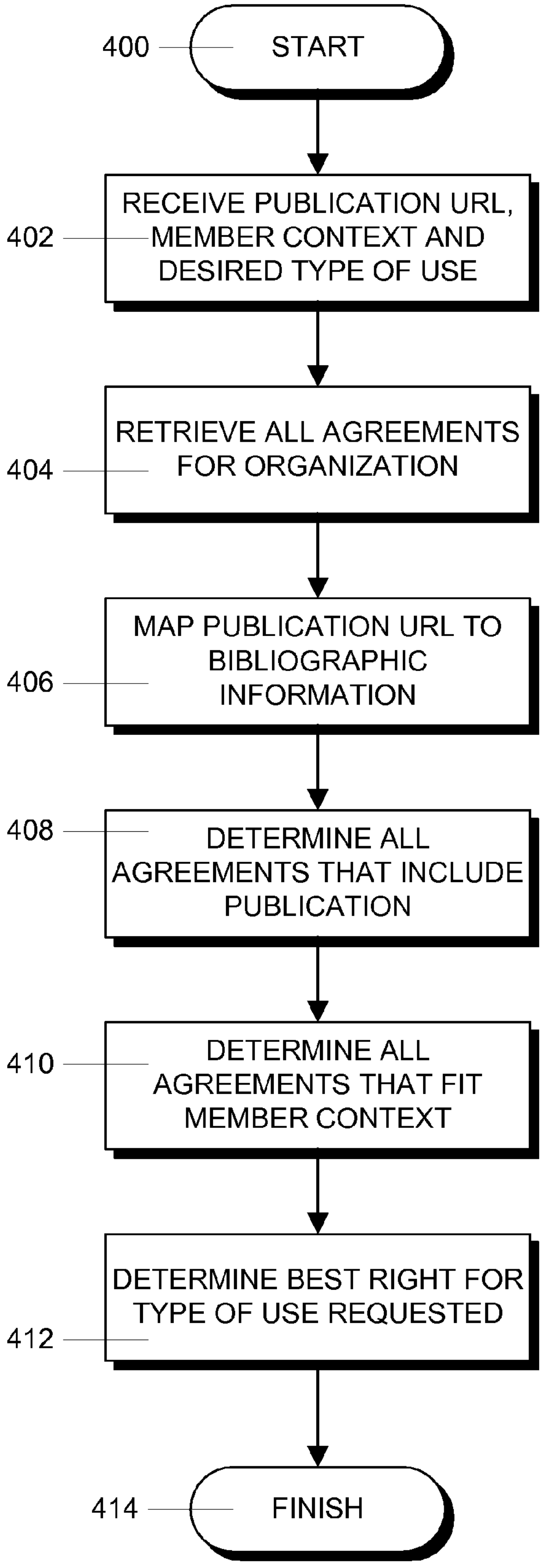
FIG. 4 is a flowchart showing the steps in an illustrative process for determining and resolving rights for a requested type of use.

The process performed by the rights advisor web page 108 to locate and resolve rights is set forth in FIG. 4. This process begins with step 400 and proceeds to step 402 where the rights advisor 108 receives a publication URL, the organization member context and a desired type of use from the bookmarklet 104. Rights that are available for an organization are defined by agreements that are stored in the rights database 112. Rights database 112 is arranged as a plurality of tables where rights are stored in a table separate from the content identifiers. Such a database is described in detail in U.S. Pat. No. 5,991,876, the content of which is incorporated in its entirety by reference. In particular, the rights database 112 contains information regarding agreements.

An agreement is any construct under which an organization obtains or expresses rights related to secondary use of content. Such agreements could include a copyright license for an entire collection of publications obtained from a rights clearinghouse. An example of such an agreement is an annual copyright license obtained from the Copyright Clearance Center. Agreements may also be made directly with a publisher, such as the Pharmaceutical Documentation Ring agreement made with the publisher Elsevier. Another type of agreement could be made with other Reproductive Rights Organizations such as a contract with the Copyright Licensing Agency in the United Kingdom. Agreements can also be obtained from various content aggregators. Such an agreement might be a Factiva license. Agreements can also be implied by statutory law, for example, Swiss law allows Swiss companies to share content without royalties. Still other agreements may involve company policy.

Figure 5:
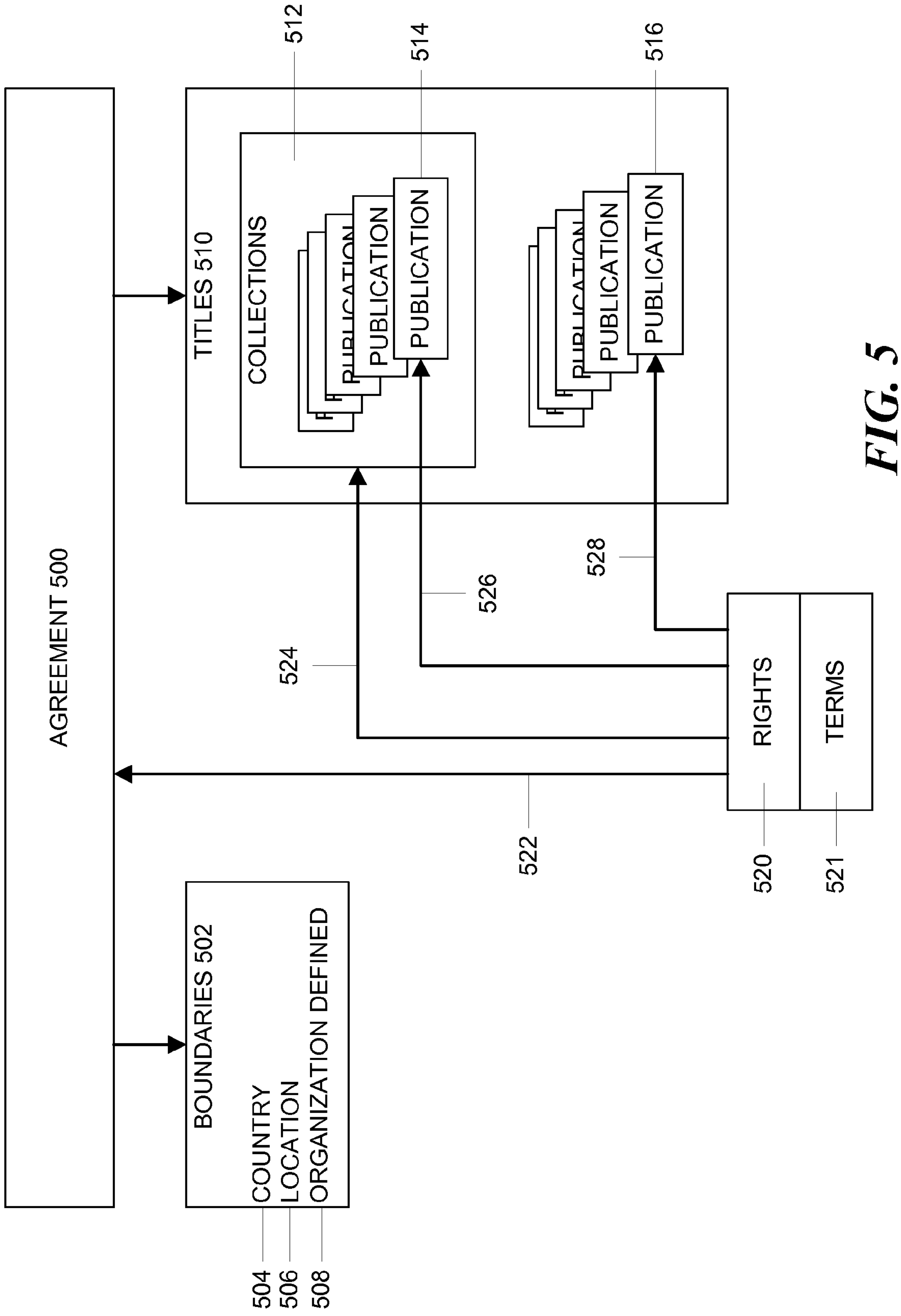
FIG. 5 is a block schematic diagram illustrating the components of an agreement.

In step 404, the rights advisor 108 accesses the rights database as indicated schematically by arrow 114 and retrieves all agreements that apply to the organization. The components of an agreement 500 as represented in the rights database 112 are shown in FIG. 5. These components include boundaries 502, titles included 510, rights 520 and terms 521. Boundaries 502 specify the member context or various constraints an organization member must meet in order to be covered by the agreement and are defined by three variables: country, location and organization defined attributes. The country variable has values corresponding to global nationalities, such as United States or France. The location variable has values that correspond to various site location of the organization, such as the Waltham site or the Wilmington site. The organization defined variable may have any values that determine, within that organization, whether the agreement applies to a member of that organization. For example, the variable may specify that a member of the organization must be part of the marketing department or part of the research and development department, etc. to be covered by the agreement. The country, location and organization defined variables may be assigned the value "any" which indicates that the agreement would apply to any member context which meets the other boundary variables. For example, the organization defined variable may be assigned a value of "any." In this case the agreement would apply to any member who meets the country and location boundary variables.

An agreement 500 also includes a designation 510 of the publications or titles that it covers. The agreement 500 may apply to collections 512, which are any grouping of publications. For example, an agreement may apply to all the titles that are included in an EBSCO subscription package. This would be considered a "public" collection; the titles included are defined by the information provider and are standard for all purchasers of the package. Another alternative would be a "private" collection. For example, an organization may create an "a la carte" subscription from a provider like EBSCO. The agreement 500 may also apply to separate publications 516 in addition to, or as an alternative to, collections 512

The third component of an agreement is the rights 520 associated with the agreement. Each right is associated with a specific type of use. In order to standardize agreements, a set of distinct rights are predefined. In the discussion below, a set of distinct types of use have been predefined for publications. However, the set of predefined rights could include more or less distinct rights as would be understood by those skilled in the art. For example, an illustrative set of predefined rights could include (1) emailing a copy of the publication to a member of the organization, (2) emailing a copy of the publication to a person who is not a member of the organization, (3) storing a copy of the publication on a local hard drive, (4) storing a copy of the publication on a shared network drive, (5) scan and then email a copy of the publication to a member of the organization, (6) scan and then email a copy of the publication to a person who is not a member of the organization, (7) photocopy publication and share with a member of the organization, (8) photocopy publication and share with a person who is not a member of the organization, (9) share a printed copy of the publication with a member of the organization, (10) share a printed copy of the publication with a person who is not a member of the organization, (11) share a copy of the publication using Lotus Notes™, (12) upload a copy of the publication to an Internet site, (13) post a copy of the publication for advertising purposes and (14) upload a copy of the publication to an electronic paper (soft billboard.)

Customers can define their own type of use, but these custom use types must map to one of the fourteen predefined use types.

Rights may be associated with each type of use. In addition, rights can be specified for the agreement 500 as indicated schematically by arrow 522, for a collection covered by the agreement as indicated schematically by arrow 524 or for individual publications within that collection as indicated schematically by arrow 526. Rights can also be assigned to separate publications that are covered individually by the agreement as indicated schematically by arrow 528.

Terms 521 may also be associated with each agreement. Terms include rights holder terms, contract terms that cannot be expressed programmatically as a right, certain statutory laws, such as Swiss law allowing publication sharing with other Swiss employees and company policies. Terms may be assigned at the publication, collection and agreement levels. In general, terms associated with rights are tagged as "Restrictive" or "Nonrestrictive". The "Restrictive" tag indicates that the associated right (such as a right to photocopy a publication) is limited by the text of the terms (for example, a restrictive term might be "only internal distribution is allowed"). The "Nonrestrictive" tag indicates the terms do not limit the applicability of the right, perhaps because they extend the scope of the permitted activity (for example, non-restrictive terms might include "There are no restrictions on the distribution of photocopies of this content").

Next, in steps 406 and 408, the rights advisor determines which agreements apply to the publication for which rights are requested. In order to perform this determination, the rights advisor uses the publication URL that it receives from the member's browser. However, publication URLs are often arbitrary, and by themselves provide no consistent means to determine whether a given article belongs to a publication with a recognized standard identifier such as an ISSN or an ISBN. Thus, in step 406, the rights advisor web page 108 maps, or translates, the URL into a standard identifier, where such an identifier is available. Using this standard identifier, the rights advisor web page 108 can check the retrieved agreements for the organization to determine which agreements apply to the specified publication.

URL mapping performed by the rights advisor relies on a variety of URL parsers, each of which uses a parsing algorithm, and a supporting database of URL formats 118. In particular, the rights advisor program 108 has a set of rules for determining which parsers are applicable to a particular URL and a set of parsers that are each able to separate a particular URL into web-site specific identifiers useful for the URL mapping task. Once these specific identifiers have been obtained, they are applied, as schematically indicated by arrow 116, to a database 118 of rules for translating the web-site specific identifiers into standard identifiers such as ISSN or ISBN identifiers. Once the standard identifiers have been obtained, they are applied, as indicated schematically by arrow 114 to a database 112 that is keyed by the standard identifiers for publications. This database 112 enumerates publication titles and the rights under which the publications can be used.

Figure 6:
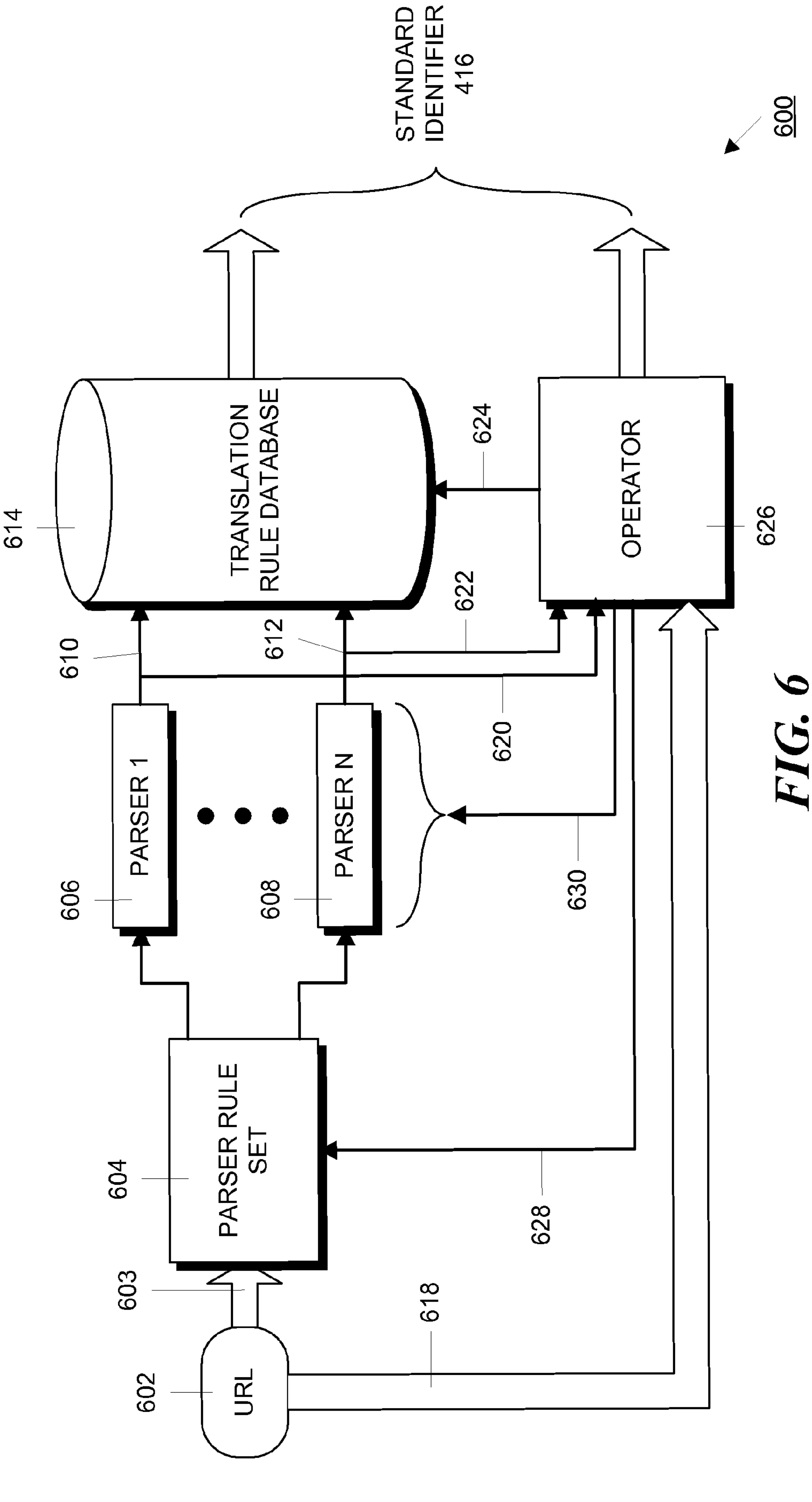
FIG. 6 is a block schematic diagram illustrating the components in a URL to publication identifier mapping apparatus.
Figure 7A:
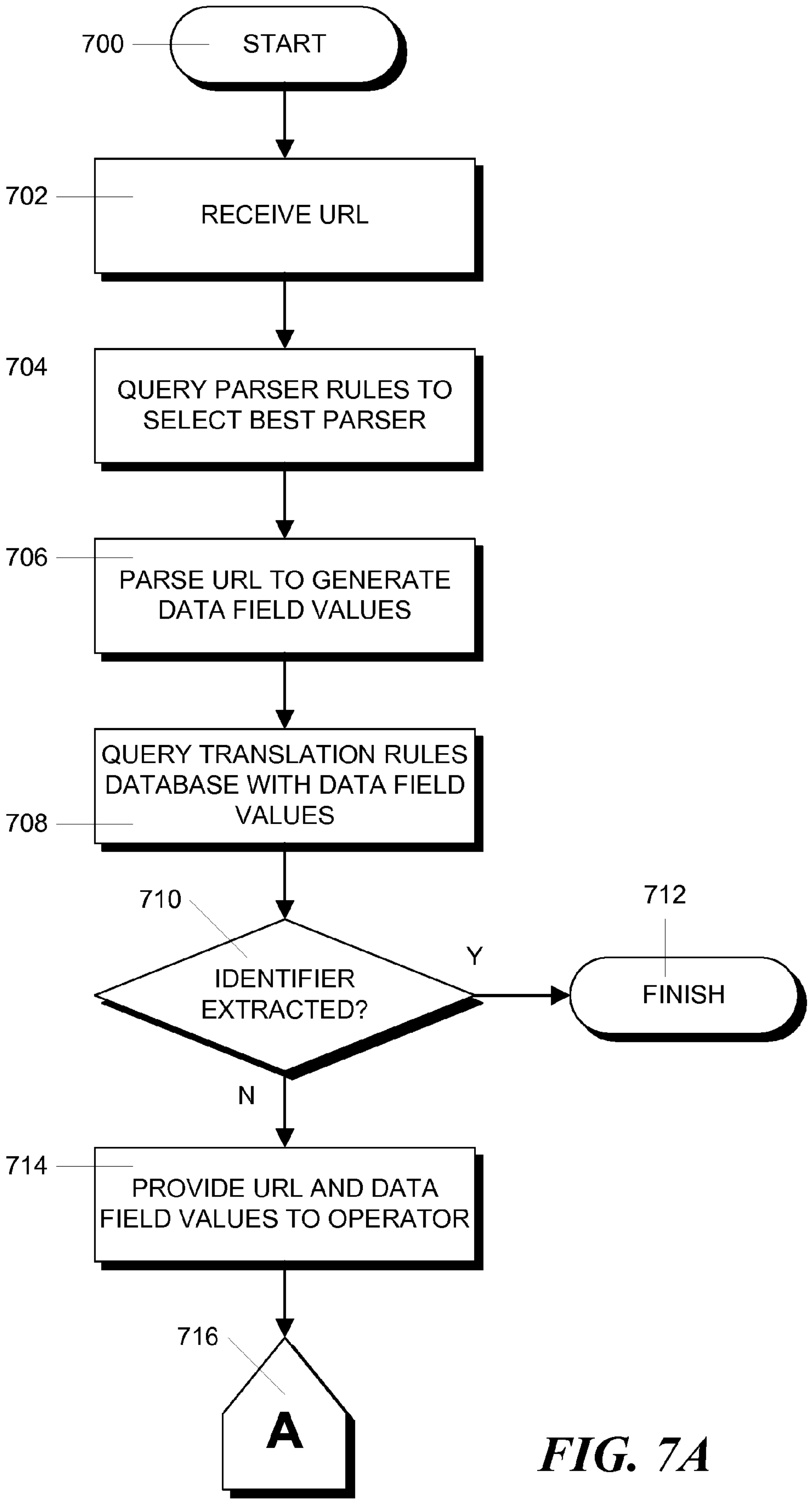
FIGS. 7A and 7B, when placed together, form a flowchart showing the steps in an illustrative process for mapping a URL to a publication identifier which process is performed by the apparatus shown in FIG. 6.
Figure 7B:
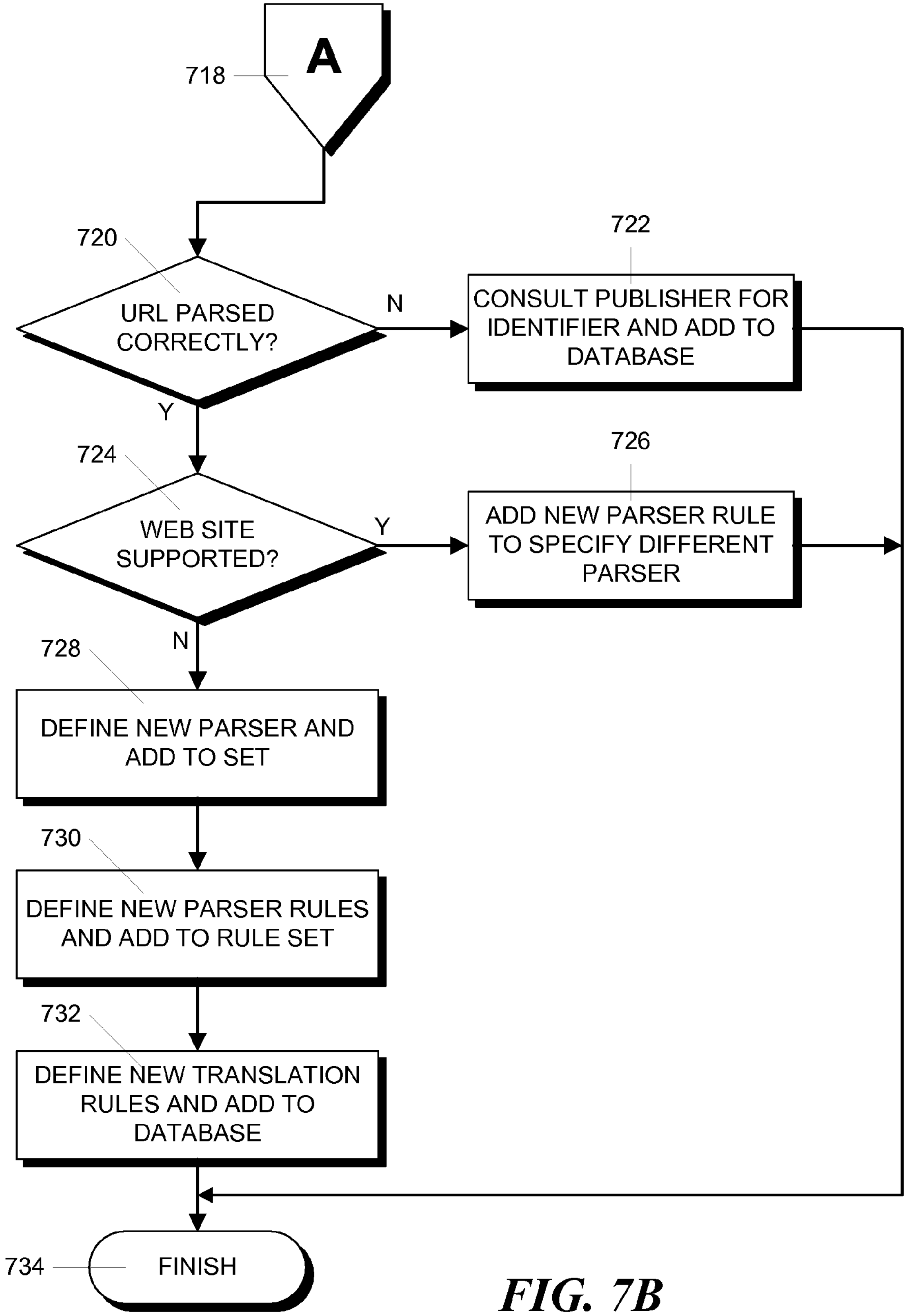

Apparatus 600 for mapping a URL to standard identifiers is illustrated in FIG. 6 and the steps in the mapping process are illustrated in FIGS. 7A and 7B. The mapping process begins in step 700 and proceeds to step 702 where a URL 602 is received from the user web browser 102. In step 704 and, as indicated by arrow 603, the URL is used to query a set of parser rules 604 to determine the most applicable parser as well as configuration settings to determine how parsers will be used in the cases that the rules identify. In particular, the domain name in the URL is matched against the set of parser rules to select rules that apply to that domain. The selected rules are then used to select and configure the parsers.

One example of a parser rule is illustrated below as a sample eXtended Markup Language (XML) configuration file. XML is a well-known language that uses tags to distinguish particular pieces of computer-readable data.

```
<parser name="EMIS" activated="Yes">
<parser__type>TwoDigitJKeyDateParser</parser__type>
<domain__identifier>emis.ams.org</domain__identifier>
<jkey__identifier>journals/</jkey__identifier>
<terminator>/</terminator>
<date__terminator>/</date__terminator>
<key__base>european__mathematical__info__servicel</key__base>
<test__url>http://www.emis.ams.org/journals/CMUC/pdf/
        cmuc9404/john.pdf</test__url>
</parser>
```

This rule matches the URL domain name "emis.ams.org" and is invoked for publications from the European Mathematical Information Service. The parser associated with this rule is a "TwoDigitJKeyDateParser" type that looks for a journal key (jkey) field and a two digit date field that follows the journal key value. The jkey field is located by the parser by an identifier character string that precedes the field. In the file above, this identifier character string is "journals/". The date and jkey fields, in turn, are defined by a terminator character string. As noted in the file, the terminator for both the date and the jkey fields is a forward slash, "/".

Thus, in the test URL field in the file above, the parser will scan the URL for the string "journals/" and extract the character string that follows this identifier up to the terminator string "/". As indicated in the test URL, this latter character string is the string "CMUC", which the parser will extract. The string in then converted to all lowercase "cmuc" and returned as the jkey or the derived publication identifier. The parser then examines the URL using the jkey value as an identifier for the date field. In the above test URL, the parser will find the character string "cmuc9404" and the date is the two digit year following the jkey "cmuc" or "94" indicating a date of 1994. This date is also extracted by the parser and returned.

Another example of a parser rule is illustrated below:

```
<parser name="SCIENCE__DIRECT" activated="Yes">
<parser__type>JKeyTagDateTagParser</parser__type>
<domain__identifier>sciencedirect.com</domain__identifier>
<jkey__identifier>__cdi=</jkey__identifier>
<terminator>/&__</terminator>
<date__identifier>__coverDate</date__identifier>
<date__terminator>&__</date__terminator>
<key__base>science__direct|</key__base>
<test__url>http://www.sciencedirect.com/science?__ob=
        Mlmg&__imagekey=B7
        GWV-4HD8DMF-1-F2&__cdi=20468&__user=
        10&__orig=browse&__coverDate=
        12%2F31 %2F2005&__sk=
        999979995&view=c&wchp=dGLbVlbzSkzS&
        md5=3b739f8dffc223711a8ea64a897da4d0&
        ie=/sdarticle.pdf</test__url>
</parser>
```

This rule matches the URL domain name "sciencedirect.com" and is invoked for publications from the Science Direct information service. The parser associated with this rule is a "JKeyTagDateTagParser" type that looks for a journal key field and a date field. The jkey field is located by the parser by an identifier character string that precedes the field. In the file above, this identifier character string is "_cdi=". The date field is located by the parser by an identifier character string that precedes the field. In the file above, this identifier character string is "_coverDate". The date and jkey fields, in turn, are defined by a terminator character string. As noted in the file, the terminator for both the date and the jkey fields is the character string "&_".

Thus, in the test URL field in the file above, the parser will scan the URL for the string "_cdi=" and extract the character string that follows this identifier up to the terminator string "&" (coded in XML as "&_"). As indicated in the test URL, this latter character string is the string "20468", which the parser will extract and returned as the jkey or the derived publication identifier. The parser then examines the URL for the date identifier up to the terminator string "&". In the above test URL, the parser will find the character string "12%2F31%2F2005" which is a URL encoded date of Dec. 31, 2005. This date is also extracted by the parser and returned.

Another parser rule is given below:

```
<parser name="AMS" activated="Yes">
<parser__type>JKeyDateParser</parser__type>
<domain__identifier>ams.org</domain__identifier>
<jkey__identifier>www.ams.org/</jkey__identifier>
<terminator>/</terminator>
<date__terminator>-</date__terminator>
<key__base>american__mathematical__society|</key__base>
<test__url>http://www.ams.org/jams/2006-19-01/S0894-0347-05-
        00505-9/S0894-0347-05-00505-9.pdf</test__url>
</parser>
```

In this parser rule the jkey identifier is "www.ams.org". The jkey field terminator is the forward slash "/". The date identifier is the jkey value and the date field terminator is the dash "-". Using these values the parser would extract from the test URL the jkey value "jams" and the four digit date value is 2006.

Another example of a parser rule operates with a parser that extracts the jkey and the volume number from a URL. This parser rule is shown below:

```
<parser name="CAMBRIDGE" activated="Yes">
<parser__type>JKeyTagVolumeTagParser</parser__type>
<domain__identifier>journals.cambridge.org</domain__identifier>
<jkey__identifier>?jid=</jkey__identifier>
<date__identifier>volumeId=</date__identifier>
<terminator>&</terminator>
<date__terminator>&</date__terminator>
<key__base>cambridge__journals|</key__base>
<test__url>http://www.journals.cambridge.org/action/displayIssue?jid=
        ECT& volumeId=21&issueId=05</test__url>
</parser>
```

In this parser rule the jkey identifier is "?jid=". The jkey field terminator is the character string "&". The date identifier is the character string "volumeid=" and the date field terminator is the character string "&". Using these values, the parser would extract from the test URL the jkey value "ECT" and the volume value 21.

Still another parser rule operates with a parser that uses the URL domain identifier as the jkey and extracts the volume number from a URL. Additional information that is coded directly into the parser rule includes the volume begin year and the number of volumes per year. This parser rule is shown below:

```
<parser name="BIOCHEM__JOURNAL" activated="Yes">
<parser__type>DomainPublicationVolumeTagParser</parser__type>
<domain__identifier>biochemj.org</domain__identifier>
<volume__identifier>bj/</volume__identifier>
<terminator>/</terminator>
<volume__terminator>/</volume__terminator>
<volume__begin__year>1956</volume__begin__year>
<volumes__per__annum>8</volumes__per__annum>
<key__base>biochem__journal|/</key__base>
<test__url>http://www.biochemj.org/bj/392/0271/3920271.pdf</test__url>
</parser>
```

In this parser rule the jkey identifier is the domain identifier, "biochemj.org". The jkey field terminator is the forward slash "/". The volume identifier is the character string "bj/" and the volume field terminator is the forward slash "/". Using these values, the parser would extract from the test URL the jkey value "biochemj.org" and the volume value 392.

In some URLs the jkey is determined by a subdomain that is part of the overall URL domain. In general, the subdomain precedes the domain identifier and is separated by a period ".". A parser rule for a parser of this type is listed below. It extracts the subdomain as the jkey and a volume number.

```
<parser name="ENDOCRINOLOGY__JOURNALS" activated="Yes">
<parser__type>SubdomainPublicationVolumeTagParser</parser__type>
<domain__identifier>endocrinology-journals.org</domain__identifier>
<volume__identifier>cgi/reprint/</volume__identifier>
<terminator>/</terminator>
<volume__terminator>/</volume__terminator>
<key__base>endocrinology__journals|</key__base>
<test__url>http://jme.endocrinology-journals.org/cgi/reprint/35/2/
283</test__url>
</parser>
```

In the test URL, the parser would extract the sub domain "jme" which becomes the jkey. The extracted volume number, which follows the identifier "cgi/reprint/" is 35.

In some cases the URL itself contains a standard identifier, such as the ISSN number. In these cases, the parser rule is particularly simple. The following is such as parser rule.

```
<parser name="BLACKWELL" activated="Yes">
<parser__type>URLISSNAndDateParser</parser__type>
<domain__identifier>blackwell-synergy.com</domain__identifier>
<jkey__identifier>/j.</jkey__identifier>
<terminator>.</terminator>
<date__terminator>.</date__terminator>
<key__base>blackwell__synergy|</key__base>
<test__url>http://www.blackwell-synergy.com/doi/pdf/10.1111/j.1467-
        6281.2004.00159.x</test__url>
</parser>
```

Here the jkey is the ISSN number. The jkey identifier is the character string "/j." and the terminator is a period "." so that, in the test URL, the jkey is 1467-6281 which is also the ISSN number. The date follows the jkey and is 2004.

Returning to FIG. 6, after selecting a parser rule set based on the domain name in the URL, one of a set of parsers, of which parsers 606 and 608 are shown, identified in the selected rule is used, in step 706, to parse the URL and generate the data field values. A parser consists of the instructions for extracting from a URL the data fields necessary to use translation rules to determine a standard identifier. One such set of data fields includes three members: the key base, the journal key and the publication date. The key base specifies a context in which the derived identifier is meaningful; in other words, a particular publisher may give all of the publications on its web site unique, proprietary numbers, and use this numbering system in the URLs for the articles on its web site. The key base in this case can be any string that specifies the publisher's web site, such as 'PUB 1'; the journal key is then the publisher's own proprietary identifier.

Parsers, such as parsers 606-608, are defined to extract data in particular formats. For instance, many publishers follow an informal convention in which the URL for an article contains the concatenation of a unique string identifying the publication with four numeric digits signifying the year and month of publication of the article. An example is the underlined string in the following URL:

"www.emis.ams.org/journals/CMUC/pdf/cmuc9404/john.pdf"

A variety of well-known parsing techniques can be used to locate the underlined string and split it into the desired components. Once a parser is created to extract this concatenated string from a URL and split the string into its two useful components, the parser can be configured with parser rules, such as those set forth above, to perform the same task for URLs of any publisher that follows this convention. Any selected parsing technology must be able to implement at least the following capabilities: within a given string, locate a specified prefix string; extract characters following the prefix string until a specified suffix string is located; and split an extracted string into multiple substrings according to simple format specifications. Conventional UNIX- or Perl-like regular expressions are easily capable of performing these parsing and extraction tasks. In general new parser rules and parsers can be added to support new URL formats.

In step 708, the extracted data field values are presented to the translation rule database 614 as indicated schematically by arrows 610 and 612. The translation database includes a plurality of entries, each entry constituting a translation rule that, in turn, includes at least three fields: the key base, the journal key and the standard identifier and may include other fields, such as date fields. The key base and journal keys are used as key fields. If the data field values presented to the translation rule database match these fields, the associated standard identifier is returned.

Since the journal key is internal data for a particular publisher, there is no guarantee that journal keys will be unique outside the context of a particular website or website subset. The key base provides a mechanism for ensuring that the journal keys can be mapped accurately to standard identifiers, such as ISSN. One design for storage of these translation entries is the following simple relational database table:

| KEY BASE | JOURNAL KEY | STANDARD IDENTIFIER |
|---|---|---|
| emis.ams.org | CMUC | 0010-2628 |

The entry depicted in the row of data can be used to translate the key base and journal key data fields extracted by parsing a URL, such as "www.emis.ams.org/journals/CMUC/cmuc0601/abs/abuosba.htm", which identifies the abstract page for a scholarly mathematical article, into an ISSN for its publication. The key base used here is the domain name of the website where the publication appears; the journal key is part of the URL and differs from publication to publication on the web site. Different database entries can be created to store different types of key bases resulting from different kinds of URLs and parsers. However, in the ordinary case, a standard identifier such as an ISSN 616 results from the database query.

If, in step 710, it is determined that such a standard identifier results from the database query, then the URL mapping process finishes in step 712. However, if it is determined, in step 710, that querying the translation rule database with the extracted data field values does not yield a standard identifier, then in step 714, a human operator 626 is provided with the given URL and the extracted field values as indicated schematically by arrows 618, 620 and 622. The process then proceeds, via off-page connectors 716 and 718 to step 720 where a determination is made whether the received URL has been parsed correctly.

If it is determined in step 720 that the URL has been parsed correctly, then the problem is that the extracted data fields do not map to a known standard identifier. This may occur, for example, when the URL identifies an article from a brand-new publication. In this case, in step 722, the operator 626 can consult the publisher of the publication for the correct standard identifier and add its value to the set of translation rules in the translation rule database 614, as indicated schematically by arrow 624. The operator then provides the standard identifier as the output of the process and the process finishes in step 734.

However, if it is determined in step 702, that the URL has not been parsed correctly, then in step 724, a determination is made whether the URL is from a currently-supported web site—that is, a web site whose top-level domain is stored in the set of parser rules and used to select a parser. If so, the problem is that the selected parser could not parse the remainder of the URL or could only extract partial fields. In this case, in step 726, the operator 626 can add a new parser rule to the parser rule set 604 as indicated schematically by arrow 628, to specify a different parser for URLs matching the new format. Again, the operator will supply the standard identifier and the process ends in step 734.

Alternatively, if, in step 724, it is determined that the web site is not supported, then in step 728, the operator 626 can define a new parser and add it to the set of URL parsers as indicated by arrow 628, then define new rules for when to apply this new kind of parser, and add these to the parser rule set 614 as indicated schematically by arrow 630. Finally, the operator 626 can define new translation rules that map the data field values extracted by the new parser to the standard identifier for the new publication, and add these to the list of translation rules in the translation rule database 614 as indicated schematically by arrow 624. The operator 626 then provides the standard identifier as an output and the process finishes in step 734. In this manner future queries of the translation rule database with the previously unsupported rule will then be able to be mapped successfully.

Returning to FIG. 4, after the standard identifier has been determined, in step 408, the rights advisor uses that identifier to determine all retrieved agreements that apply to the identified publication. Next, in step 410, a determination is made of all agreements that fit the member context. This determination is made by examining the boundaries of each agreement to then determining whether that agreement covers the member country and location and that the member meets any organization defined attributes.

In step 412 the best right for the type of use requested is determined. The process then finishes in step 414.

Figure 8:
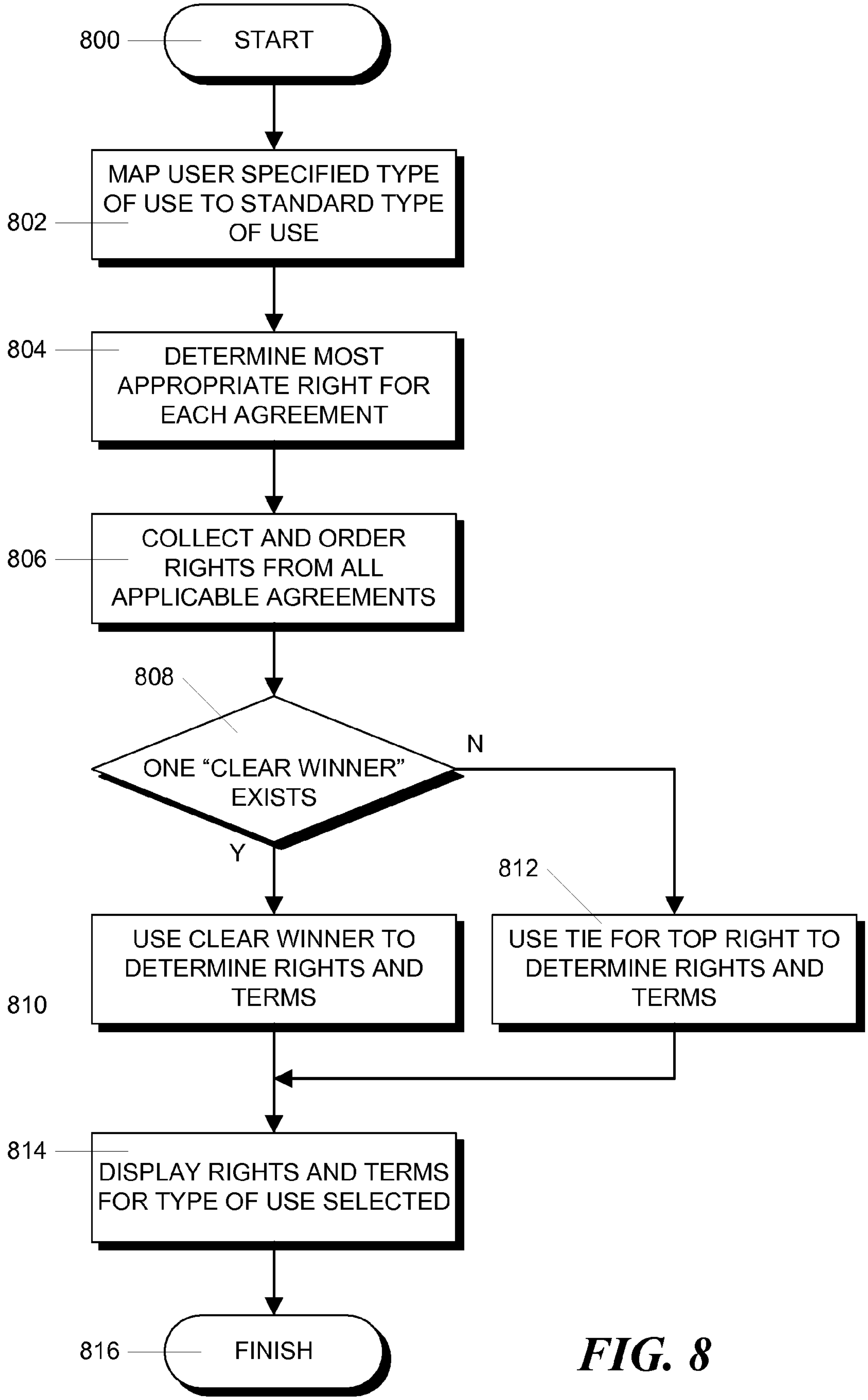
FIG. 8 is a flowchart showing the steps in an illustrative process for determining rights and resolving conflicts between agreements for a particular requested type of use.

The process of determining the best right as set forth in step 412 is shown in more detail in FIG. 8. This process begins in step 800 and proceeds to step 802 where, if user specified types of use are used in the system, they are mapped into one or more the pre-defined types of use discussed above.

Next, in step 804, each agreement that applies to the publication and meets the member context is examined to determine the most appropriate right for the specified type of use that is included in the agreement. In performing this examination, each agreement is examined from the "bottom up." That is, more specific rights supersede more general rights. Thus, an agreement is first examined to determine whether a right for the type of use requested has been assigned directly to the specified publication, either by itself or to the publication as contained in a collection. If such a right is found it is the right used for that agreement. If no such right has been assigned to the publication, the agreement is next checked to determine whether a right for requested type of use has been assigned to a collection that includes the specified publication. If so, it is the right that is used for that publication. If no such right is found, then the agreement is checked to determine whether a right for the type of use has been assigned at the agreement level. If so, that right is used for the agreement.

Next, in step 806, the most applicable rights from all agreements are collected and ordered. In particular, rights are placed into a hierarchy with a specific "best" to "worst" order based on the type of right and whether any terms are associated with the right. For purposes of resolution, rights with terms tagged as "Nonrestrictive" are treated as rights without terms—that is, at the highest level of applicability. The hierarchical order of rights from best applicability to worst applicability is (1) right to use granted with no associated terms, (2) right to use granted with associated restrictive terms, (3) rights available for purchase under a pre-authorized contract, (4) rights available for purchase, but rights holder must be contacted with more information, (5) rights available for purchase, but those rights must be special ordered, (6) contact librarian to determine rights and (7) no rights available. If a right cannot be determined it is treated as (6) above.

After the available rights have been collected and ordered, a determination is made whether the ordering yields one "clear winner." That is, one agreement includes a right that is more applicable than rights included in all other agreements. If so, this "clear winner" is used to determine the rights and terms for the requested type of use in step 810. These rights and terms are then displayed to the member in step 814 and the process finishes in step 816.

In, in step 808, it is determined that no "clear winner" exists, then a "tie" exists between two or more agreements. Ties among two or more rights can take several forms. For example, a tie between two or more rights without terms indicates that identical rights are available from two different agreements. Since the rights are identical and indistinguishable, one agreement is selected by a variety of techniques (for example, arbitrarily) and the rights and terms of that agreement are displayed.

Alternatively, a tie between two or more rights with terms results in the display of all such rights together with the terms, so that the end user can make an informed judgment as to the permissibility of the requested activity.

Another example is a tie between two or more rights with "Purchase" status. Such a tie results in the display of a list of the purchase information or capability for all such rights.

In addition, terms associated with rights may be informational. An informational term is a term that presents information to the member without overriding another term or being overridden by another term. Examples of informational terms include statements of company policy for a given type of use or other statements that would give guidance to the user as to how to proceed. Specifying an informational term for an agreement will create a tie condition with other terms on the same agreement, so that the additional information will always be displayed in a list with the terms specified by that agreement.

Using the guidelines discussed above, one of the agreements that has the best available right is selected in step 812 and the rights and terms for this agreement are displayed to the member. Again, the process finishes in step 816.

Figure 9:
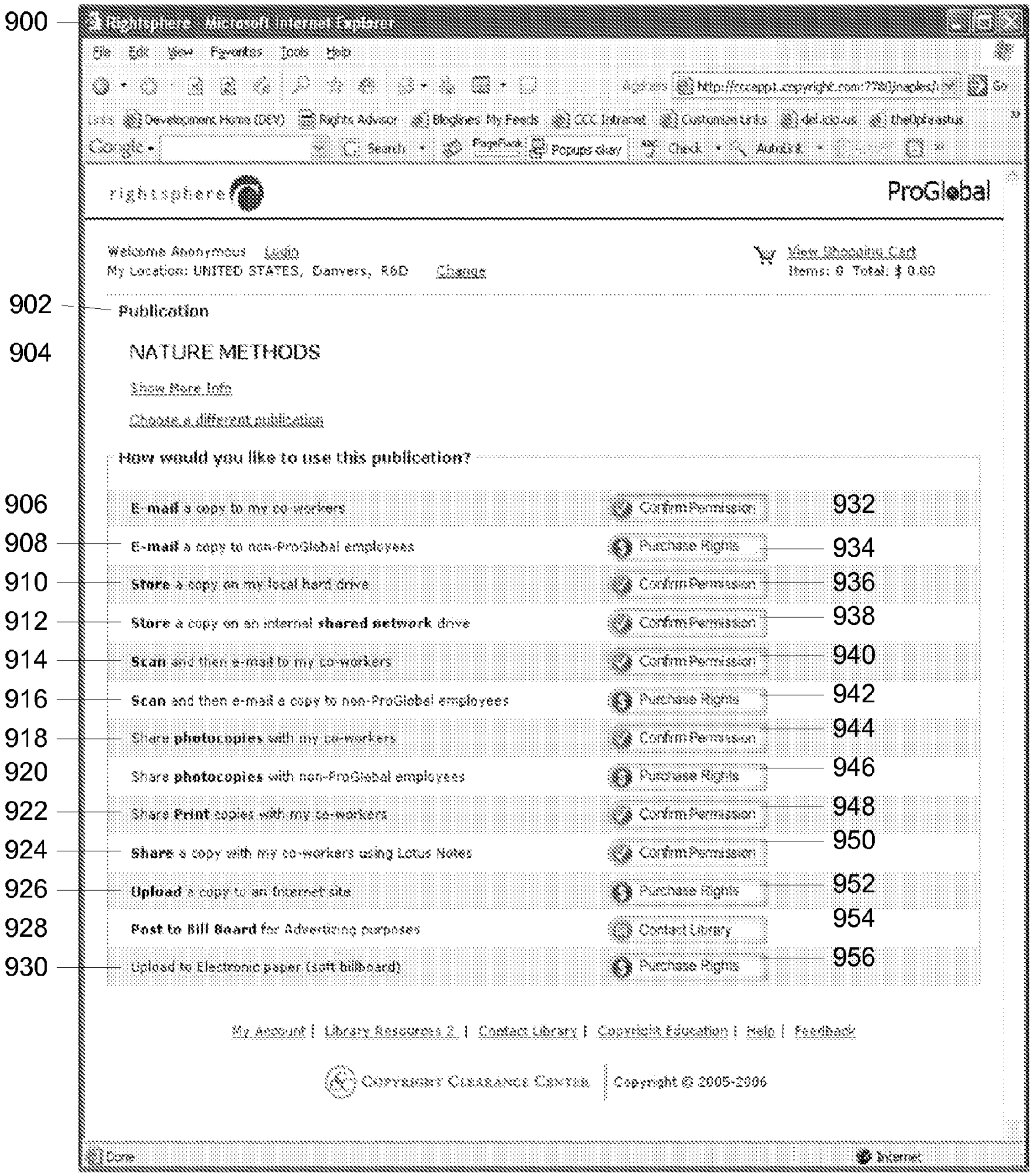
FIG. 9 is a screen display generated in accordance with one embodiment after a member has requested rights for a publication in which the best available rights are display for fourteen pre-defined rights.

In another embodiment, once a publication has been selected, the "best" rights which are available for all fourteen illustrative types of use are determined and presented to the member simultaneously. FIG. 9 is a screen display of a set of fourteen use types with the accompanying best available right displayed. The display shows a browser screen 900. This screen display shows the member context 902, including the country, location and organization-specified attributes and the selected publication 904.

The fourteen types of use that are available to members are displayed in a list with one type of use in each row 906-930 of the list. Opposite each type of use, the best available right is displayed. For example, for the use "E-mail a copy of the publication to my co-workers" 906, the best available right is "Confirm Permission" 932. However, for the use "E-mail a copy of the publication to non-Pro-Global employees" 908, the best available right is "Purchase Rights" 934. Other rights may also be displayed. For example, the type of use "Post to Bill Board for Advertising Purposes" 928 has the right "Contact Library" 954 displayed.

Figure 10:
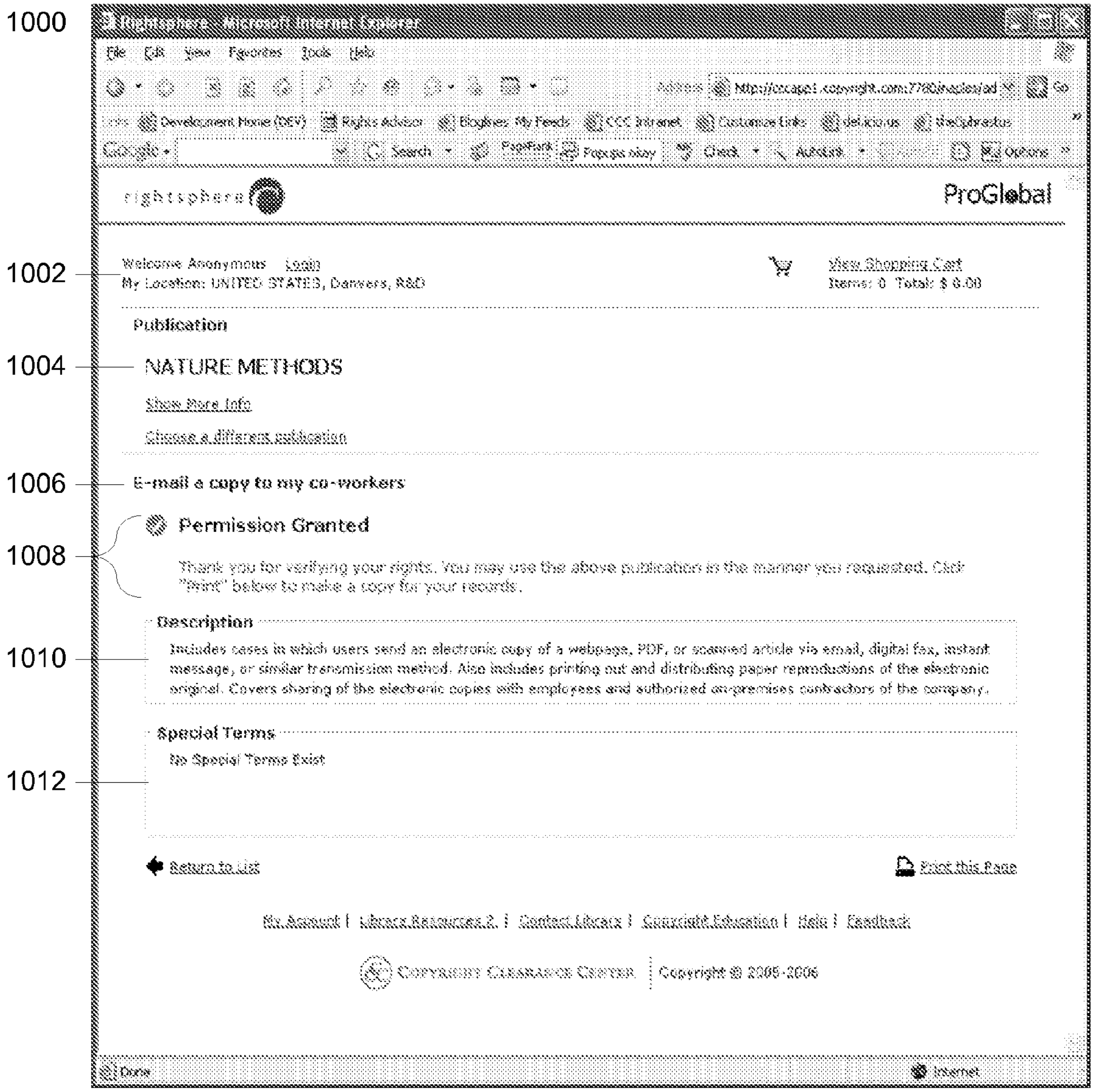
FIG. 10 is a screen display generated in accordance with one embodiment, which screen display is generated when a member selects the right command button for the first displayed type of use in which the right to that type of use is granted.

Each right is display as the caption of one of command buttons 932-956. When one of commands buttons 932-956 is selected, further information concerning the associated rights is displayed. For example, when button 932 is selected, the screen display shown in FIG. 9 changes to that shown in FIG. 10. This browser display 1000 includes the same member context information 1002 and publication information 1004 as shown in the screen display shown in FIG. 9, but the type of use and right display has been replaced with information 1006 indicating the type of use selected and the right granted 1008. Further information 1010 is displayed specifically describing the use allowed. If special terms are associated with the right, they are displayed in section 1012.

The selection of other right command buttons generates a similar screen display. For example, when button 934 in FIG. 9 is selected, the screen display shown in FIG. 9 changes to that shown in FIG. 11. This browser display 1100 includes the same member context information 1102 and publication information 1104 as shown in the screen display shown in FIG. 9, but the type of use and right display has been replaced with information 1106 indicating the type of use selected and the right granted 1108. Further information 1110 is displayed specifically describing the use allowed. In this case, special terms are displayed in section 1112. Since the right is available for purchase, a further purchasing section 1114 is also displayed. This section includes information relevant to the purchase and areas to add additional information. For example, a text box 1116 may be provided to allow the member to indicate how many recipients will receive the publication. The unit price 1118 is displayed. A further command button 1120 allows the purchase to be added to a conventional "shopping cart" metaphor.

Figure 11:
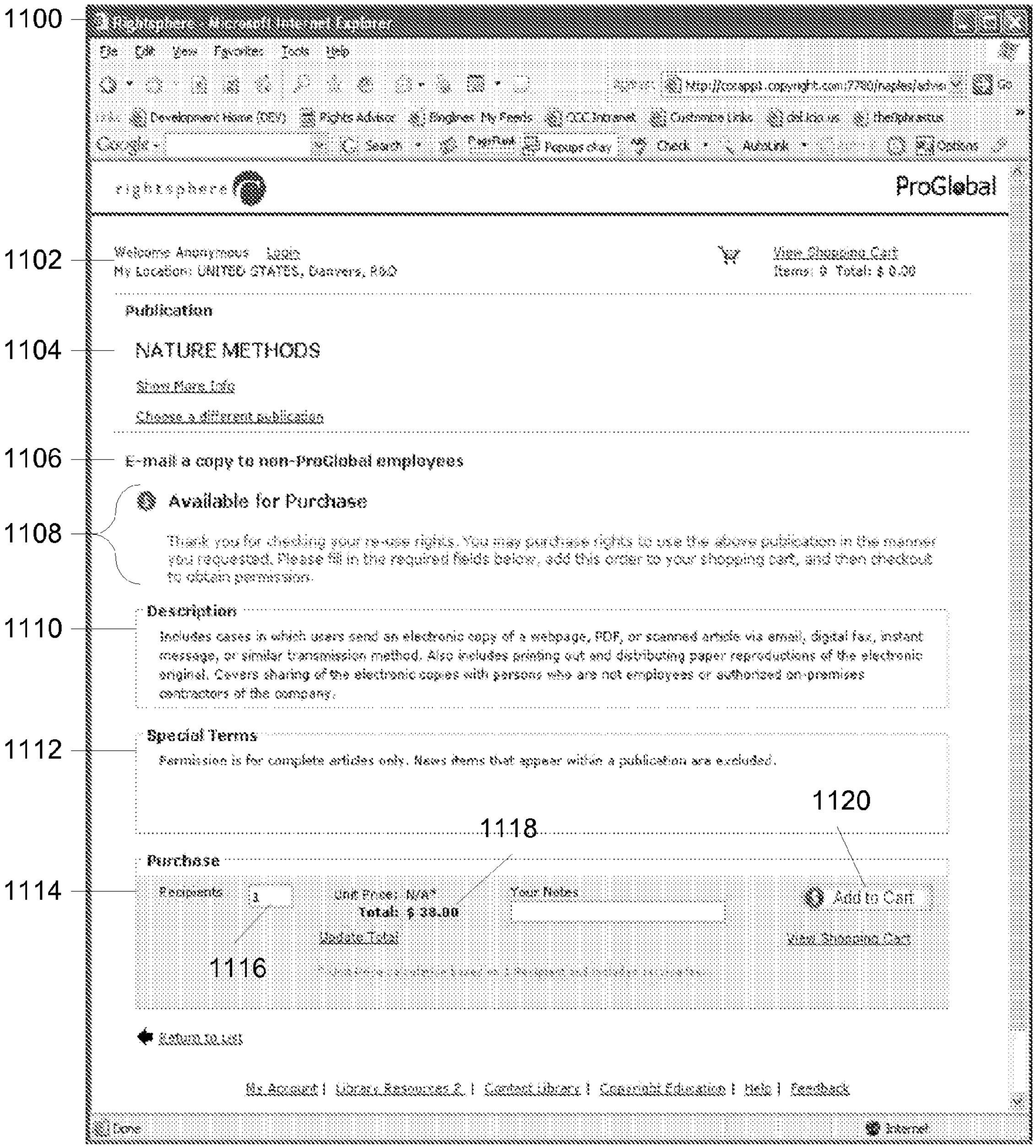
FIG. 11 is a screen display generated in accordance with one embodiment, which screen display is generated when a member selects the right command button for the second displayed type of use in which the right to that type of use can be purchased.
Figure 12:
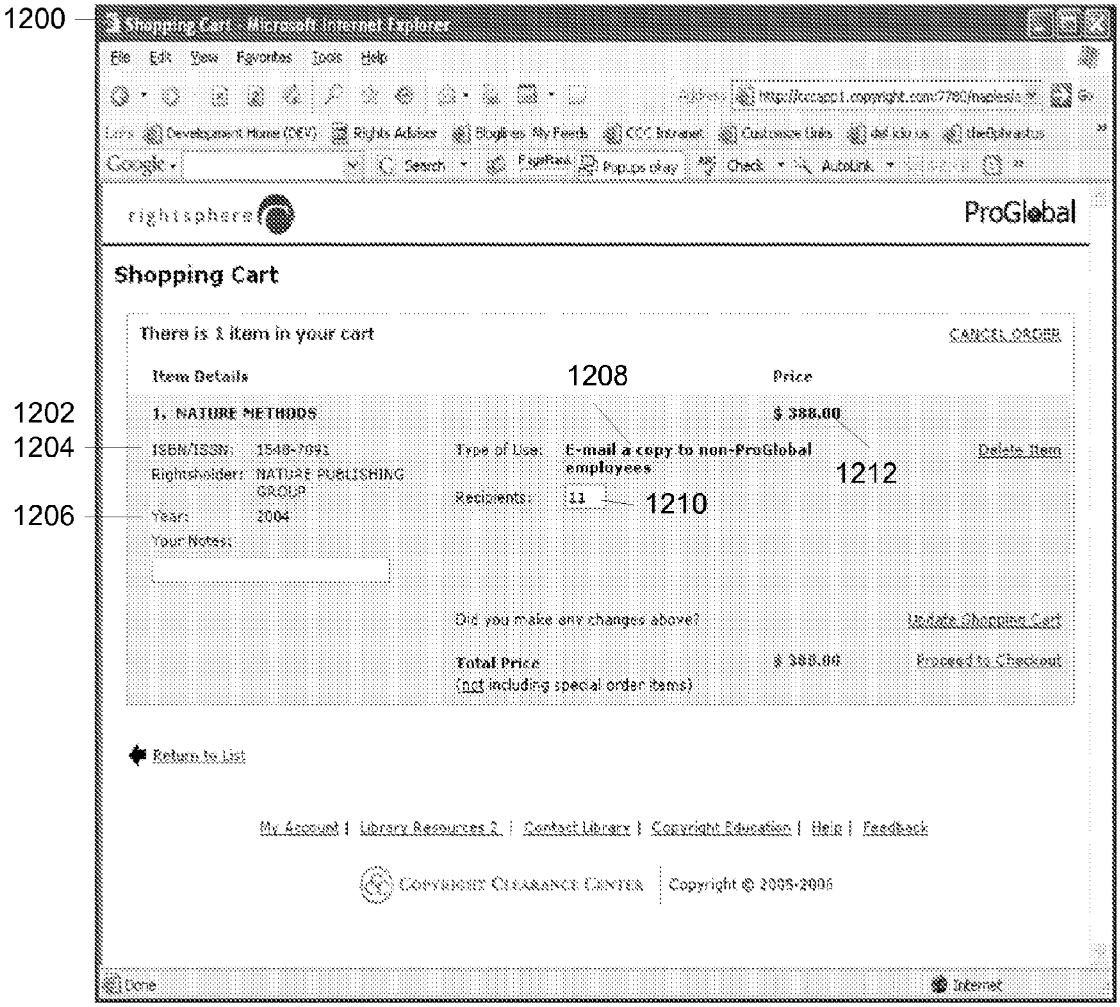
FIG. 12 is a screen display generated in accordance with one embodiment, which screen display is generated when a member selects the "shopping cart" button display in FIG. 11.

Selection of the shopping cart command button 1120 causes the screen display in FIG. 11 to change to that shown in FIG. 12. This browser display 1200 displays the publication selected 1202 along with its standard identifier 1204 and additional information, such as the publication year. The selected type of use 1208 is also displayed along with the number of recipients 1210 entered by the member and the total price 1212. Conventional sales mechanisms allow the member to purchase the rights.

A software implementation of the above-described embodiment may comprise a series of computer instructions either fixed on a tangible medium, such as a computer readable media, for example, a diskette, a CD-ROM, a ROM, or a fixed disk, or transmittable to a computer system via a modem or other interface device over a transmission path. The transmission path either may be tangible lines, including but not limited to, optical or analog communications lines, or may be implemented with wireless techniques, including but not limited to microwave, infrared or other transmission techniques. The transmission path may also be the Internet. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable medium with accompanying printed or electronic documentation, e.g., shrink wrapped software, pre-loaded with a computer system, e.g., on system ROM or fixed disk, or distributed from a server or electronic bulletin board over a network, e.g., the Internet or World Wide Web.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, in other implementations, process operations different from those shown may be performed. Other aspects, such as the specific process flow and the order of the illustrated steps, as well as other modifications to the inventive concept are intended to be covered by the appended claims.

The invention claimed is:

1. A method for resolving rights to reuse content in a publication having information associated therewith displayed on a display screen controlled by a computer having a processor, the method comprising:

(a) providing by the computer an area on the display screen that activates a link to a rights advisor program running in a memory of a rights server;

(b) storing by the rights server rights agreements that govern rights to reuse content and have been entered into by a plurality of organizations;

(c) receiving a selection of the area by the computer from a pointing device connected to the computer and, in response thereto, obtaining context information including information identifying one of the plurality of organizations;

(d) sending by the computer the context information and a uniform resource locator (URL) associated with the publication to the rights server, whereupon the rights server uses the rights advisor program to retrieve all stored rights agreements entered into by the one organization;

(e) determining, by the rights server using the rights advisor program with the URL, rights set forth in the retrieved rights agreements that cover the publication;

(f) creating by the rights server a hierarchy that extends from a worst applicable right to a best applicable right by using the rights advisor program to arrange the rights determined in step (e);

(g) determining by the rights server the best applicable rights by examining the hierarchy using the rights advisor program, and (h) presenting by the rights server on the display screen the best applicable rights.

2. The method of claim 1 further comprising:

(i) accessing the rights advisor program via a website to purchase rights for a specific reuse for which the one organization does not have rights.

3. The method of claim 1 wherein agreements stored in the rights server are stored in a rights database that contains a predetermined set of reuse rights for each publication in the rights database.

4. The method of claim 1 wherein step (b) comprises grouping publications in the rights database into collections and associating a set of rights with a collection so that all publications in that collection inherit the rights associated with that collection.

5. The method of claim 1 wherein step (h) comprises presenting the best applicable rights on the display screen via a browser.

6. The method of claim 1 wherein step (h) further comprises presenting a textual display of terms associated with each right along with the best applicable rights.

7. The method of claim 1 wherein step (e) comprises converting the URL of the publication to a standard publication identifier and using the standard publication identifier to determine rights set forth in the retrieved rights agreements that cover the publication.

8. The method of claim 1 wherein step (e) further comprises filtering the retrieved rights agreements based on selected characteristics of the context information and selecting applicable rights from the filtered agreements.

9. The method of claim 8 wherein variables that are used to filter agreements include a country, a location within that country and other attributes defined by the one organization.

10. The method of claim 9 wherein step (e) further comprises selecting a most specific right in each filtered agreement.

11. The method of claim 1 wherein step (g) comprises selecting a right when the ordering in step (f) yields an agreement that includes a right that is more applicable than rights in other agreements.

12. The method of claim 11 wherein step (h) further comprises presenting at least two rights when no agreement includes a right that is more applicable than rights in other agreements.

13. Apparatus for resolving rights to reuse content in a resource having information associated therewith displayed on a display screen, the apparatus comprising a computer having a processor and a memory storing instructions, which when executed, cause the processor to perform the steps of:

(a) providing by the computer an area on the display screen that activates a link to a rights advisor program running in a memory of a rights server;

(b) storing by the rights server rights agreements that govern rights to reuse content and have been entered into by a plurality of organizations;

(c) receiving a selection of the area by the computer from a pointing device connected to the computer and, in response thereto, obtaining context information including information identifying one of the plurality of organizations;

(d) sending by the computer the context information and a uniform resource locator (URL) associated with the publication to the rights server, whereupon the rights server uses the rights advisor program to retrieve all stored rights agreements entered into by the one organization;

(e) determining, by the rights server using the rights advisor program with the URL, rights set forth in the retrieved rights agreements that cover the publication;

(f) creating by the rights server a hierarchy that extends from a worst applicable right to a best applicable right by using the rights advisor program to arrange the rights determined in step (e);

(g) determining by the rights server the best applicable rights by examining the hierarchy using the rights advisor program, and (h) presenting by the rights server on the display screen the best applicable rights.

14. The apparatus of claim 13 further comprising: (i) accessing the rights advisor program via a website to purchase rights for a specific reuse for which the one organization does not have rights.

15. The apparatus of claim 13 wherein agreements stored in the rights server are stored in a rights database that contains a predetermined set of reuse rights for each publication in the rights database.

16. The apparatus of claim 15 wherein step (b) comprises grouping publications in the rights database into collections and associating a set of rights with a collection so that all publications in that collection inherit the rights associated with that collection.

17. The apparatus of claim 13 wherein step (h) comprises presenting the best applicable rights on the display screen via a browser.

18. The apparatus of claim 13 wherein step (h) further comprises presenting a textual display of terms associated with each right along with the best applicable rights.

19. The apparatus of claim 13 wherein step (e) comprises converting the URL of the publication to a standard publication identifier and using the standard publication identifier to determine rights set forth in the retrieved rights agreements that cover the publication.

20. The apparatus of claim 13 wherein step (e) further comprises filtering the retrieved rights agreements based on selected characteristics of the context information and selecting applicable rights from the filtered agreements.

21. The apparatus of claim 20 wherein variables that are used to filter agreements include a country, a location within that country and other attributes defined by the one organization.

22. The apparatus of claim 20 wherein step (e) further comprises selecting a most specific right in each filtered agreement.

23. The apparatus of claim 13 wherein step (g) comprises selecting a right when the ordering in step (f) yields an agreement that includes a right that is more applicable than rights in other agreements.

24. The apparatus of claim 23 wherein step (h) further comprises presenting at least two rights when no agreement includes a right that is more applicable than rights in other agreements.

* * * * *